United States Patent
Nelson et al.

(10) Patent No.: US 12,200,853 B2
(45) Date of Patent: Jan. 14, 2025

(54) EMBEDDABLE ELECTRICALLY INSULATING THERMAL CONNECTOR AND CIRCUIT BOARD INCLUDING THE SAME

(71) Applicant: KYOCERA AVX Components Corporation, Fountain Inn, SC (US)

(72) Inventors: Cory Nelson, Simpsonville, SC (US); Jeff Borgman, Myrtle Beach, SC (US); Marianne Berolini, Greer, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

(21) Appl. No.: 17/849,841

(22) Filed: Jun. 27, 2022

(65) Prior Publication Data

US 2022/0418081 A1 Dec. 29, 2022

Related U.S. Application Data

(60) Provisional application No. 63/215,622, filed on Jun. 28, 2021.

(51) Int. Cl.
| | |
|---|---|
| H05K 1/02 | (2006.01) |
| H05K 1/11 | (2006.01) |
| H05K 1/18 | (2006.01) |
| H05K 3/00 | (2006.01) |
| H05K 3/30 | (2006.01) |
| H05K 3/40 | (2006.01) |

(52) U.S. Cl.
CPC .......... *H05K 1/0203* (2013.01); *H05K 1/115* (2013.01); *H05K 1/185* (2013.01); *H05K 3/0047* (2013.01); *H05K 3/30* (2013.01); *H05K 3/4038* (2013.01); *H05K 1/0204* (2013.01); *H05K 1/0206* (2013.01); *H05K 1/11* (2013.01)

(58) Field of Classification Search
CPC ...... H05K 1/0203; H05K 1/115; H05K 1/185; H05K 3/0047; H05K 3/30; H05K 3/4038; H05K 2201/066; H05K 1/0206
See application file for complete search history.

(56) References Cited

U.S. PATENT DOCUMENTS

| | | | |
|---|---|---|---|
| 5,390,072 A | 2/1995 | Anderson et al. | |
| 5,731,067 A * | 3/1998 | Asai | H01L 23/3677 257/E23.105 |
| 6,349,033 B1 * | 2/2002 | Dubin | H01L 23/3737 257/E23.101 |

(Continued)

FOREIGN PATENT DOCUMENTS

JP 20101578663 A 7/2010

OTHER PUBLICATIONS

International Search Report and Written Opinion for PCT/US2022/035088 dated Oct. 21, 2022, 10 pages.

*Primary Examiner* — Ishwarbhai B Patel
(74) *Attorney, Agent, or Firm* — Dority & Manning, P.A.

(57) ABSTRACT

A heat sink component can include a body including a thermally conductive material that is electrically non-conductive, a lower conductive layer formed over a bottom surface of the body and electrically connected with the ground plane layer, and an upper conductive layer formed over a top surface of the body. The heat sink component can have a length in an X-direction that is parallel with the top surface of the body and a thickness in a direction perpendicular to the top surface. A ratio of the length to the thickness can be greater than about 7.

23 Claims, 7 Drawing Sheets

(56) References Cited

U.S. PATENT DOCUMENTS

| | | |
|---|---|---|
| 8,039,759 B2 | 10/2011 | Lee et al. |
| 8,830,691 B2 | 9/2014 | Inagaki et al. |
| 9,941,054 B2 | 4/2018 | Sankman et al. |
| 10,957,807 B2 | 3/2021 | Kotru et al. |
| 11,116,109 B2 | 9/2021 | Durgin |
| 11,626,340 B2 | 4/2023 | Anderson et al. |
| 2014/0076492 A1 | 3/2014 | Lai et al. |
| 2014/0251658 A1* | 9/2014 | Lin ..................... H05K 1/0271 174/252 |
| 2014/0355215 A1* | 12/2014 | Canete ............. H01L 23/49827 361/720 |
| 2016/0143129 A1* | 5/2016 | Min ..................... H05K 1/0231 174/252 |
| 2016/0249445 A1* | 8/2016 | Min ..................... H05K 1/0204 |
| 2017/0141744 A1 | 5/2017 | Kim et al. |
| 2017/0263546 A1* | 9/2017 | Lin .................. H01L 23/49838 |
| 2020/0260610 A1* | 8/2020 | Durgin .................. H05K 1/115 |
| 2020/0312734 A1* | 10/2020 | Su ........................ H01L 23/367 |
| 2020/0402720 A1 | 12/2020 | Marin et al. |
| 2022/0367732 A1 | 11/2022 | Nelson et al. |
| 2022/0367733 A1 | 11/2022 | Nelson et al. |

* cited by examiner

EMBEDDABLE ELECTRICALLY INSULATING THERMAL CONNECTOR AND CIRCUIT BOARD INCLUDING THE SAME

CROSS REFERENCE TO RELATED APPLICATION

The present application claims filing benefit of U.S. Provisional Patent Application Ser. No. 63/215,622, having a filing date of Jun. 28, 2021, which is incorporated herein by reference in its entirety.

BACKGROUND OF THE INVENTION

Electrical circuits, such as power amplifier circuits, generate heat during normal operation. Heat build-up may undesirably increase the temperature of the various components of the electrical circuit. If this heat is not sufficiently managed, for example by dissipation to a heat sink, the electrical device may overheat, resulting in damage to the electrical component. Circuit boards often include an embedded ground plane. Vias or other electrically conductive connectors facilitate heat flow from a heat sink terminal on a surface of the circuit board to the ground plane and away from surface mount components. Connecting an electrical component directly to such a heat sink terminal, however, may undesirably create an electrical connection between the electrical component and the ground plane and disrupt the operation of the electrical component.

SUMMARY OF THE INVENTION

In accordance with one embodiment of the present invention, a heat sink component can include a body including a thermally conductive material that is electrically non-conductive, a lower conductive layer formed over a bottom surface of the body and electrically connected with the ground plane layer, and an upper conductive layer formed over a top surface of the body. The heat sink component can have a length in an X-direction that is parallel with the top surface of the body and a thickness in a direction perpendicular to the top surface. A ratio of the length to the thickness can be greater than about 7.

In accordance with another embodiment of the present invention, a circuit board can include a substrate including a mounting surface and a ground plane layer spaced apart from the mounting surface. The circuit board can include a heat sink component at least partially embedded within the substrate. The heat sink component can include a body including a thermally conductive material that is electrically non-conductive and a lower conductive layer formed over a bottom surface of the body and electrically connected with the ground plane layer, and an upper conductive layer formed over a top surface of the body. A via can be electrically connected with the upper conductive layer and extending toward the mounting surface.

In accordance with another embodiment of the present invention, a method of manufacturing a circuit board can include an embedded heat sink component. The method can include providing a substrate comprising a mounting surface. The substrate can include a ground plane layer spaced apart from the mounting surface. The method can include forming a lower conductive layer formed over a bottom surface of a body comprising a thermally conductive material that is electrically non-conductive; forming an upper conductive layer formed over a top surface of the body; embedding the heat sink component at least partially within the substrate such that the lower conductive layer of the heat sink component is electrically connected with the ground plane layer; drilling a via hole through the substrate into the upper conductive layer; and plating the via hole to form a via electrically connected with the upper conductive layer and extending toward the mounting surface of the substrate.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figure in which.

Repeat use of reference characters in the present specification and drawing is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a heat sink component configured for embedding in a circuit board and a circuit board including an embedded heat sink component. The circuit board can include a substrate having a mounting surface. The circuit board can include a ground plane layer spaced apart from the mounting surface. A heat sink component can be at least partially embedded within the substrate. The heat sink component can include a body comprising a thermally conductive material that is electrically non-conductive and a lower conductive layer formed over a bottom surface of the body and electrically connected with the ground plane layer. The heat sink component can include an upper conductive layer formed over a top surface of the body. One or more vias can electrically connect with the upper conductive layer and extend toward the mounting surface. For example, the via(s) can extend to the mounting surface of the circuit board. One or more terminals can be formed on the mounting surface and be electrically connected the via(s). Such terminals can serve as a heat sink for the mounting surface that does not provide an electrical connection with the ground plane layer. The terminals may include copper, gold, or another suitable conductive material.

The heat sink component can generally be sized for embedding within the circuit board. For example, a ratio of a length of the heat sink component to a thickness of the heat sink component can greater than about 7, in some embodiments greater than 10, in some embodiments greater than 15, in some embodiments greater than 20, in some embodiments greater than 100, and in some embodiments greater than about 500.

The heat sink component can be relatively thin to facilitate embedding within the substrate of the circuit board. For example, the heat sink component can have a thickness of less than about 250 microns, in some embodiments less than about 200 microns, in some embodiments less than about 175 microns, and in some embodiments less than about 150 microns.

The upper conductive layers can have relatively large thicknesses for facilitating forming the vias. For example, the vias can be formed by drilling one or more via holes through the substrate into the upper conductive layer. The via hole(s) can be plated to form the via(s) such that the vias are electrically connected with the upper conductive layer(s) and extend toward the mounting surface of the substrate.

For example, the thicknesses of the upper conductive layer can range from about 1 micron to 50 microns, in some embodiments from about 2 microns to about 25 microns, in some embodiments, from about 4 microns to about 10 microns, and in some embodiments from about 5 microns to about 7 microns.

In some embodiments, the heat sink component can include at least one thin film component. The thin film component can include one or more of a resistor, varistor, capacitor, inductor, and/or combinations thereof, such as a thin film filter. The thin film components may include one or more layers of conductive materials, dielectric materials, resistive materials, inductive materials, or other materials that are precisely formed using "thin film" technology.

As one example, the thin film component(s) can include a thin film varistor. The varistor can include barium titanate, zinc oxide, or any other suitable dielectric material. Various additives may be included in the dielectric material, for example, that produce or enhance the voltage-dependent resistance of the dielectric material. For example, in some embodiments, the additives may include oxides of cobalt, bismuth, manganese, or a combination thereof. In some embodiments, the additives may include oxides of gallium, aluminum, antimony, chromium, titanium, lead, barium, nickel, vanadium, tin, or combinations thereof. The dielectric material may be doped with the additive(s) ranging from about 0.5 mole percent to about 3 mole percent, and in some embodiments from about 1 mole percent to about 2 mole percent. The average grain size of the dielectric material may contribute to the non-linear properties of the dielectric material. In some embodiments, the average grain size may range from about 1 micron to 100 microns, in some embodiments, from about 2 microns to 80 microns.

As another example, the thin film component(s) can include a thin film resistor including one or more resistive layers. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials. The resistive layer may have any suitable thickness.

As another example, the thin film component(s) can include a thin film capacitor including one or more dielectric layers. As examples, the dielectric layer(s) may include one or more suitable ceramic materials. Example suitable materials include alumina (Al2O3), aluminum nitride (AlN), beryllium oxide (BeO), aluminum oxide (Al2O3), boron nitride (BN), silicon (Si), silicon carbide (SiC), silica (SiO2), silicon nitride (Si3N4), gallium arsenide (GaAs), gallium nitride (GaN), zirconium dioxide (ZrO2), mixtures thereof, oxides and/or nitrides of such materials, or any other suitable ceramic material. Additional example ceramic materials include barium titanate (BaTiO3), calcium titanate (CaTiO3), zinc oxide (ZnO), ceramics containing low-fire glass, or other glass-bonded materials.

The thin film component can include one or more layers having thicknesses ranging from about 0.001 µm to about 1,000 µm, in some embodiments from about 0.01 µm to about 100 µm, in some embodiments from about 0.1 µm to about 50 µm, in some embodiments from about 0.5 µm to about 20 µm. The respective layer(s) of materials forming thin film component may be applied using specialized techniques based on etching, photolithography, PECVD (Plasma Enhanced Chemical Vapor Deposition) processing or other techniques.

In some embodiments, multiple upper conductive layers can be formed on the upper surface. For example, the upper conductive layers can be arranged in a repeating pattern. This can provide additional locations on the upper surface at which to form a connection, for example using a via.

The body of the heat sink component can include a thermally conductive material that is electrically non-conductive. As is known in the art, thermal resistivity and thermal conductivity of a material are inversely related. Thus, a low thermal resistivity correlates with a high thermal conductivity. The body of the heat sink component may include any suitable material having a generally low thermal resistivity (e.g., less than about $6.67 \times 10^{-3}$ m·°C./W), and a generally high electrical resistivity (e.g., greater than about $10^{14}$ Ω·cm). A thermal resistivity of $6.67 \times 10^{-3}$ m·°C./W is equivalent with a thermal conductivity of about 150 W/m·°C. In other words, suitable materials for the body of the heat sink component may have a generally high thermal conductivity, such as greater than about 150 W/m·°C.

For example, in some embodiments, the body of the heat sink component may be made from a material having a thermal conductivity between about 100 W/m·°C. and about 300 W/m·°C. at about 22°C. In other embodiments, the electrically insulating body of the heat sink component may be made from a material having a thermal conductivity between about 125 W/m·°C. and about 250 W/m·°C. at about 22°C. In other embodiments, the electrically insulating body of the heat sink component may be made from a material having a thermal conductivity between about 150 W/m·°C. and about 200 W/m·°C. at about 22°C.

In some embodiments, the body of the heat sink component may comprise aluminum nitride, beryllium oxide, aluminum oxide, boron nitride, silicon nitride, magnesium oxide, zinc oxide, silicon carbide, any suitable ceramic material, and mixtures thereof.

In some embodiments, the body of the heat sink component may comprise aluminum nitride. For example, in some embodiments the body of the heat sink component may be made from any suitable composition including aluminum nitride. In some embodiments, the body of the heat sink component may be made primarily from aluminum nitride. For example, the body of the heat sink component may contain additives or impurities. In other embodiments, the body of the heat sink component comprises beryllium oxide. For example, in some embodiments the body of the heat sink component may be made from any suitable composition including beryllium oxide. In some embodiments, the body of the heat sink component may be made primarily from beryllium oxide. For example, the body of the heat sink component may contain additives or impurities.

Figure 1:
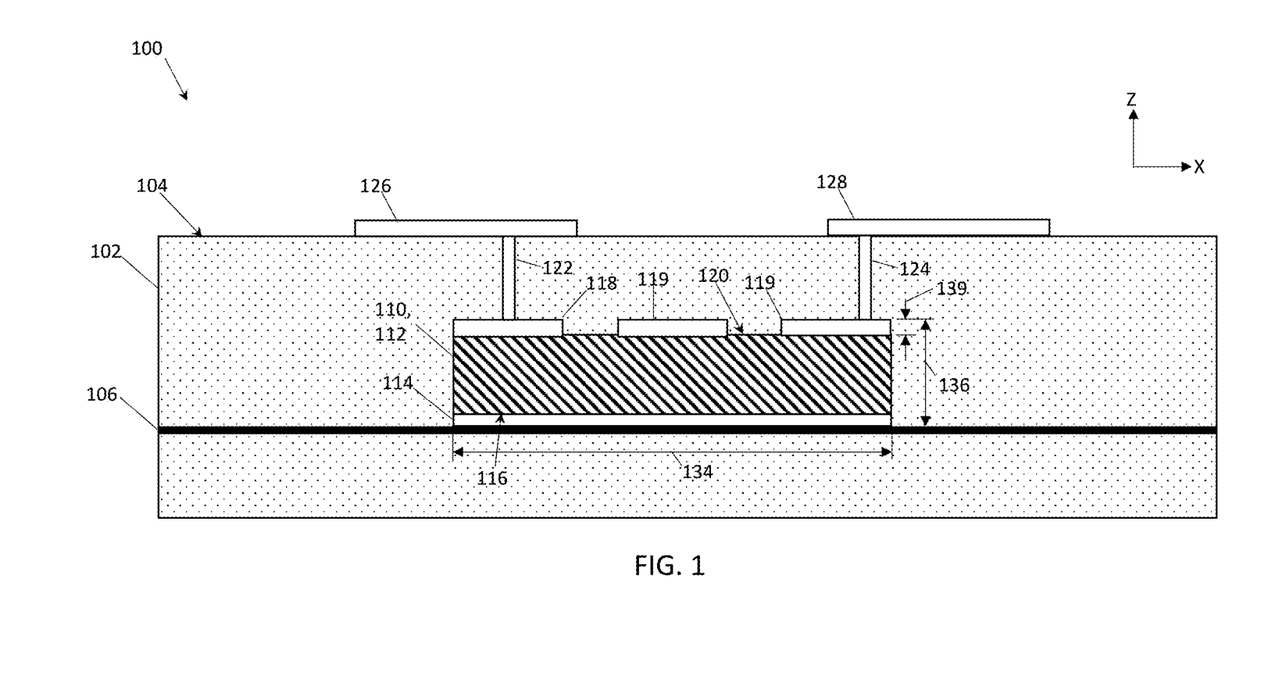
FIG. 1 is a side elevation view of a circuit board according to aspects of the present invention.

FIG. 1 is a side elevation view of a circuit board 100 according to aspects of the present disclosure. The circuit board 100 can include a substrate 102 including a mounting surface 104. The circuit board 100 can include a ground plane layer 106 spaced apart from the mounting surface 104. A heat sink component 110 can be at least partially embedded within the substrate 102. The heat sink component 110 can include a body 112 comprising a thermally conductive material that is electrically non-conductive. The heat sink component 110 can include a lower conductive layer 114 formed over a bottom surface 116 of the body 112 and electrically connected with the ground plane layer 106. For example, the lower conductive layer 114 of the heat sink component 110 can directly contact the ground plane layer 106. The heat sink component 110 can include an upper conductive layer 118 formed over a top surface 120 of the body 112. One or more vias 122, 124 may electrically connect with the upper conductive layer and extend toward the mounting surface 104.

One or more heat sink terminals 126, 128 may be formed over the mounting surface 104. The via(s) 122, 124 can extend from the upper conductive layer(s) 118 to the mounting surface 104 and connect with the heat sink terminal(s) 126, 128.

The heat sink component 110 can have a length 134 in the X-direction, which can be parallel with the mounting surface 104 of the substrate 102. The heat sink component 110 can have a thickness 136 in the Z-direction, which can be perpendicular to the mounting surface 104. The thickness 136 can be relatively small with respect to the length 134 of the heat sink component 110. For example, a ratio of the length 134 to the thickness 136 can be greater than about 7.

The heat sink component 110 can have a width 138 in a Y-direction, which can be perpendicular to the X-direction and parallel with top surface 120. The thickness 136 can be relatively small with respect to the width 138 of the heat sink component 110. For example, a ratio of the width 138 to the thickness 136 can be greater than about 7.

The upper conductive layers 118, 119 can have relatively large thicknesses 139 for facilitating forming the vias 122, 124. The vias 122, 124 can be formed by drilling one or more via holes through the substrate 102 into the upper conductive layer 118, 119. The via hole(s) can be plated to form the via(s) 122, 124 such that the vias 122, 124 are electrically connected with the upper conductive layer(s) 122, 124 and extend toward the mounting surface 104 of the substrate 102.

Figure 2A:
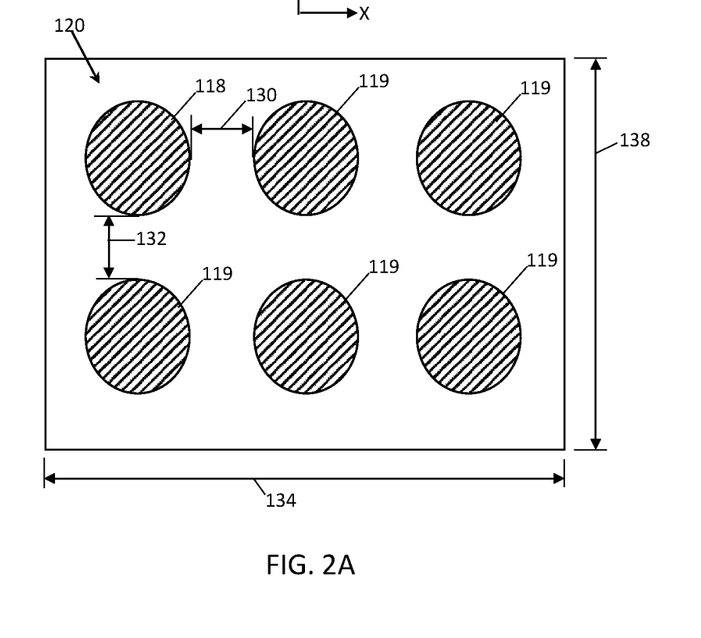
FIG. 2A illustrates one example repeating patterns of upper conductive layers on an upper surface of a heat sink component according to aspects of the present invention.
Figure 2B:
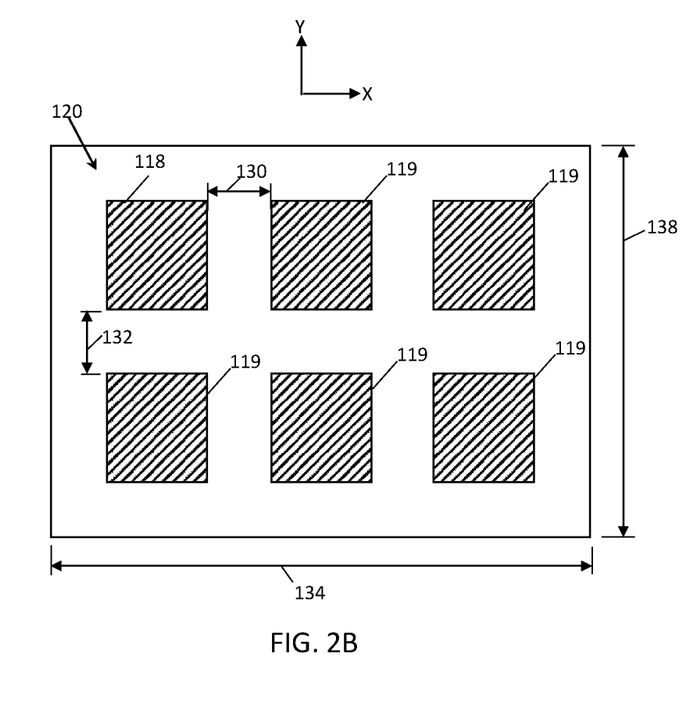
FIG. 2B illustrates another example repeating patterns of upper conductive layers on an upper surface of a heat sink component according to aspects of the present invention.

FIGS. 2A and 2B illustrate example repeating patterns of the upper conductive layer(s) 118, 119 on the upper surface 120 of the heat sink component 110. One additional upper conductive layer 119 can be spaced apart from the upper conductive layer 118 on the upper surface 120. The upper conductive layer(s) 118, 119 can be spaced apart in the X-direction by a pitch distance 130 and spaced apart in the Y-direction by a yaw distance 132. As shown in FIG. 2A, the upper conductive layers 118, 119 can have a generally circular shape. As shown in FIG. 2B, the upper conductive layers 118, 119 can have a generally square or rectangular shape. The upper conductive layers 118, 119 can have a variety of other shapes, such as triangular, ovular, or rhomboid, or any other suitable shape. The upper conductive layer 118, 119 can be arranged in a grid having rows extending in the X-direction and columns extending in the Y-direction. However, any suitable repeating pattern can be employed.

Figure 3:
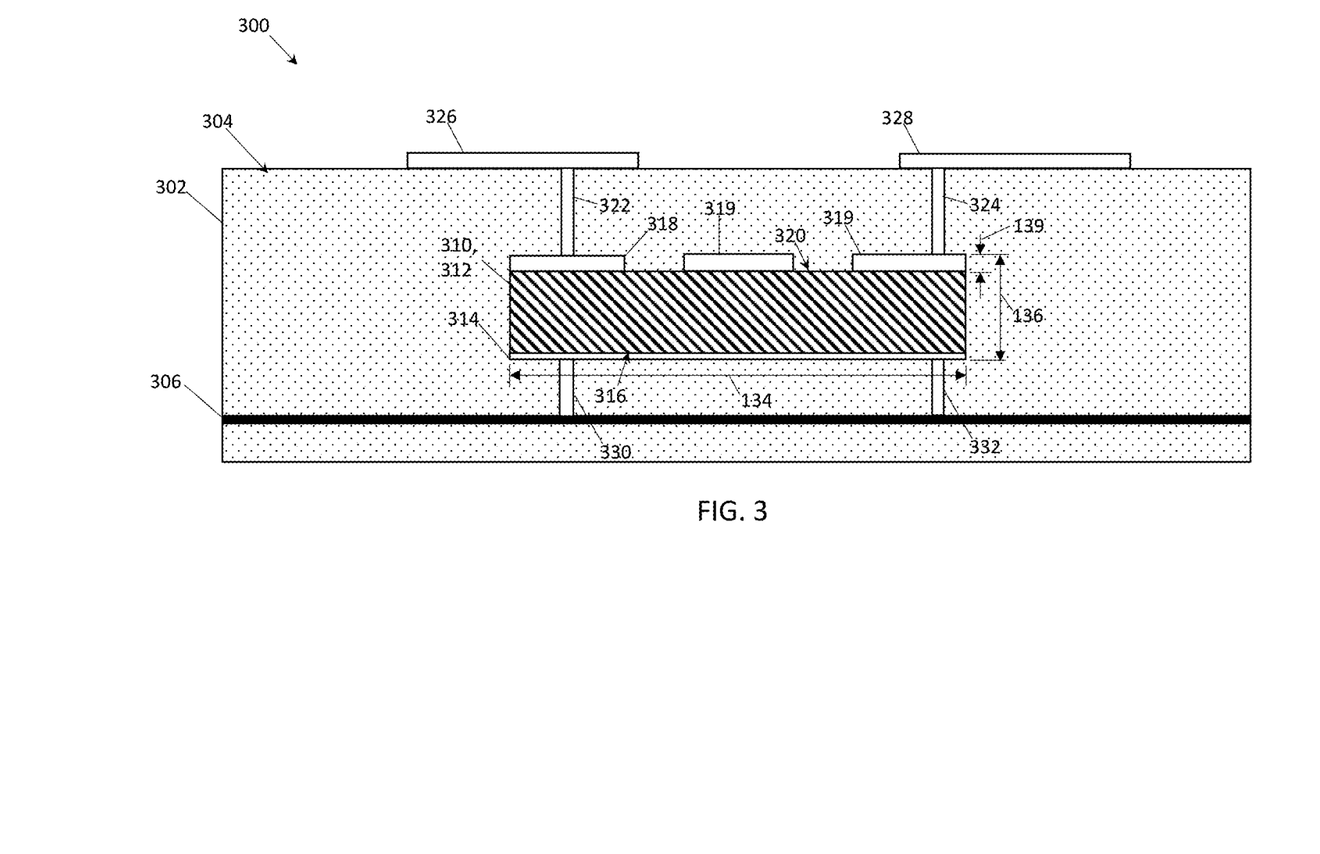
FIG. 3 is a side elevation view of a circuit board in which one or more vias are connect a lower conductive layer of a heat sink component with a ground plane layer.

FIG. 3 is a side elevation view of another embodiment of a circuit board 300 according to aspects of the present invention. The circuit board 300 can include a substrate 302 including a mounting surface 304. The circuit board 300 can be generally configured in a similar manner as the circuit board 100 of FIG. 1. The circuit board 300 can include a ground plane layer 306 spaced apart from the mounting surface 304. A heat sink component 310 can be at least partially embedded within the substrate 302. The heat sink component 310 can include a body 312 comprising a thermally conductive material that is electrically non-conductive.

The heat sink component 310 can include a lower conductive layer 314 formed over a bottom surface 316 of the body 312 and electrically connected with the ground plane layer 306. The lower conductive layer 314 can be electrically connected with the ground plane layer 306 by one or more vias 330, 332. The vias(s) 330, 332 can extend in the Z-direction from the lower conductive layer 314 to the ground plane layer 306. The heat sink component 310 can include an upper conductive layer 318 formed over a top surface 320 of the body 312.

Figure 4A:
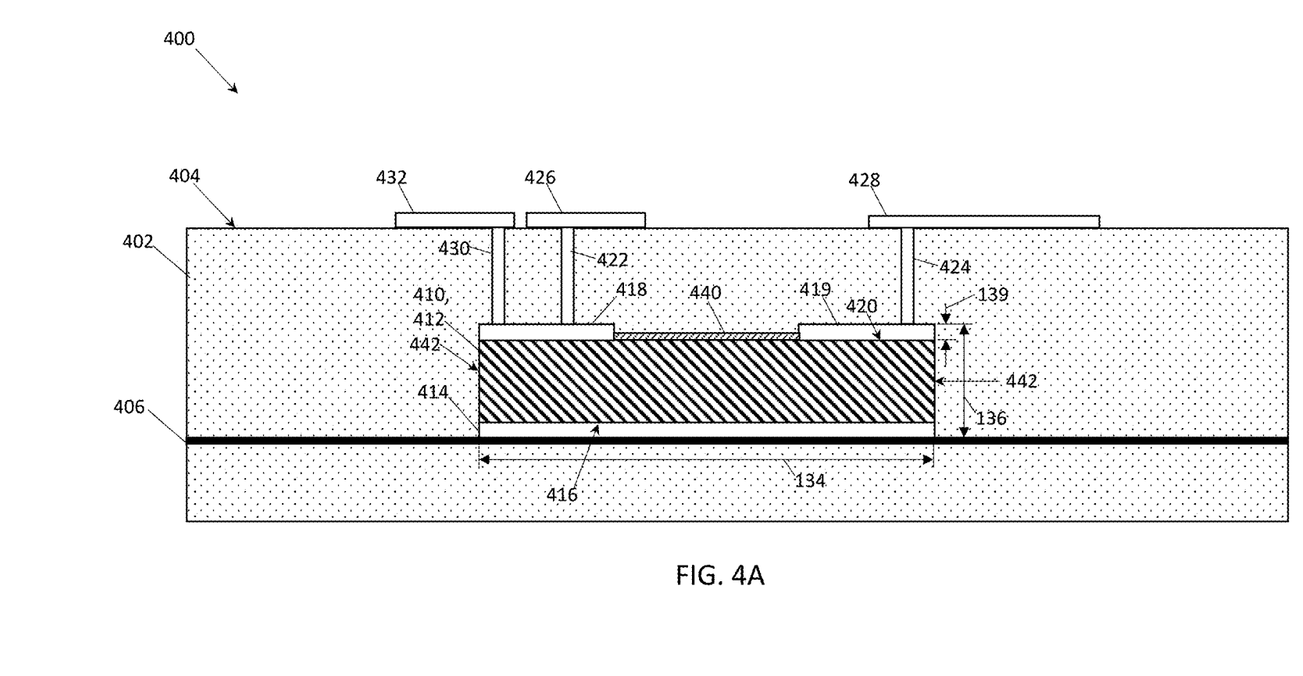
FIG. 4A is a side elevation view of another embodiment of a circuit board including a heat sink component that includes a thin-film component according to aspects of the present invention.
Figure 4B:
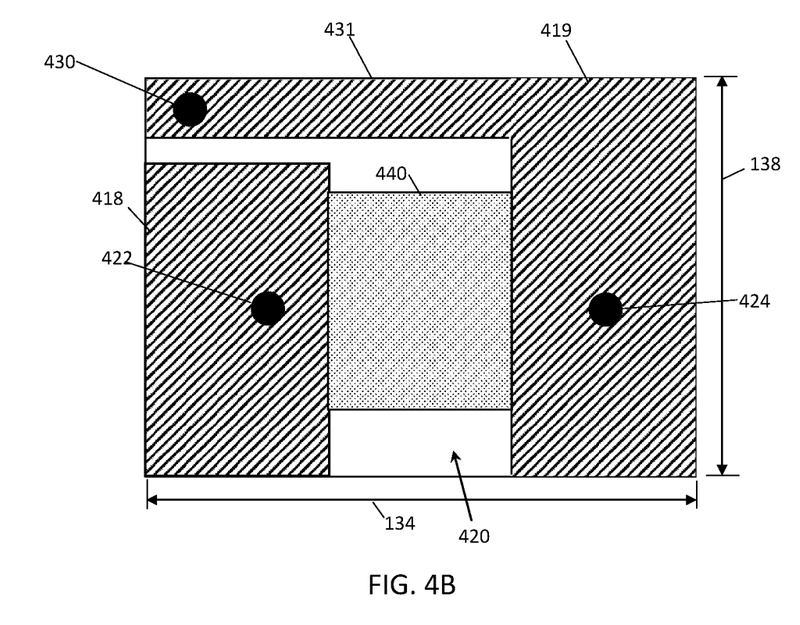
FIG. 4B illustrates upper conductive layer(s) on an upper surface of the heat sink component of FIG. 4A.

FIG. 4A is a side elevation view of another embodiment of a circuit board 400 according to aspects of the present invention. FIG. 4B is a top-down view of a top surface 420 of a body 412 of a heat sink component 410. The circuit board 400 can generally be configured similarly to the circuit board 300 of FIG. 3. The circuit board 400 can include a ground plane layer 406 spaced apart from a mounting surface 404. The heat sink component 410 can be at least partially embedded within the substrate 402. The heat sink component 410 can include the body 412 comprising a thermally conductive material that is electrically non-conductive. The heat sink component 410 can include a first upper conductive layer 418 and a second upper conductive layer 419, each formed over the top surface 420 of the body 412.

Additionally, in this embodiment heat sink component 410 can include one or more thin film components 440. In this example, the thin film component 440 is formed over the top surface 420 and connected between the first upper conductive layer 418 and the second upper conductive layer 419. However, in other embodiments, the thin film component can be formed on the bottom surface 416, or a side surface 442 of the body 412. This arrangement can provide a desired circuit between the first heat sink terminal 426 and the second heat sink terminal 428, yet still insulate the first and second heat sink terminals 426, 428 from the ground plane 406.

As one example, the thin-film component 440 can include a thin film resistor. As another example, the thin-film component 440 can include a thin film capacitor. As yet further examples, the thin-film component 440 can include a varistor, inductor, or combination of resistor, capacitor, varistor, and inductor.

In some embodiments, the heat sink component 410 can act as interposer or the like. The heat sink component 410 can include a via 430 connected with a connector 431 extending from the second upper conductive layer 419. The via 430 can connect with a third heat sink terminal 432, which can be disposed on the mounting surface 404. The heat sink component 410 can provide a direct electrical connection between the second heat sink terminal 428 and the third heat sink terminal 432. Thus, the heat sink component 410 can be configured to provide electrical connections between select terminals, provide thin-film components between select terminals, and/or act merely as a heat sink without providing electrical connection for other terminals (e.g., as described above with respect to the heat sink terminal 126 of FIG. 1).

Figure 5:
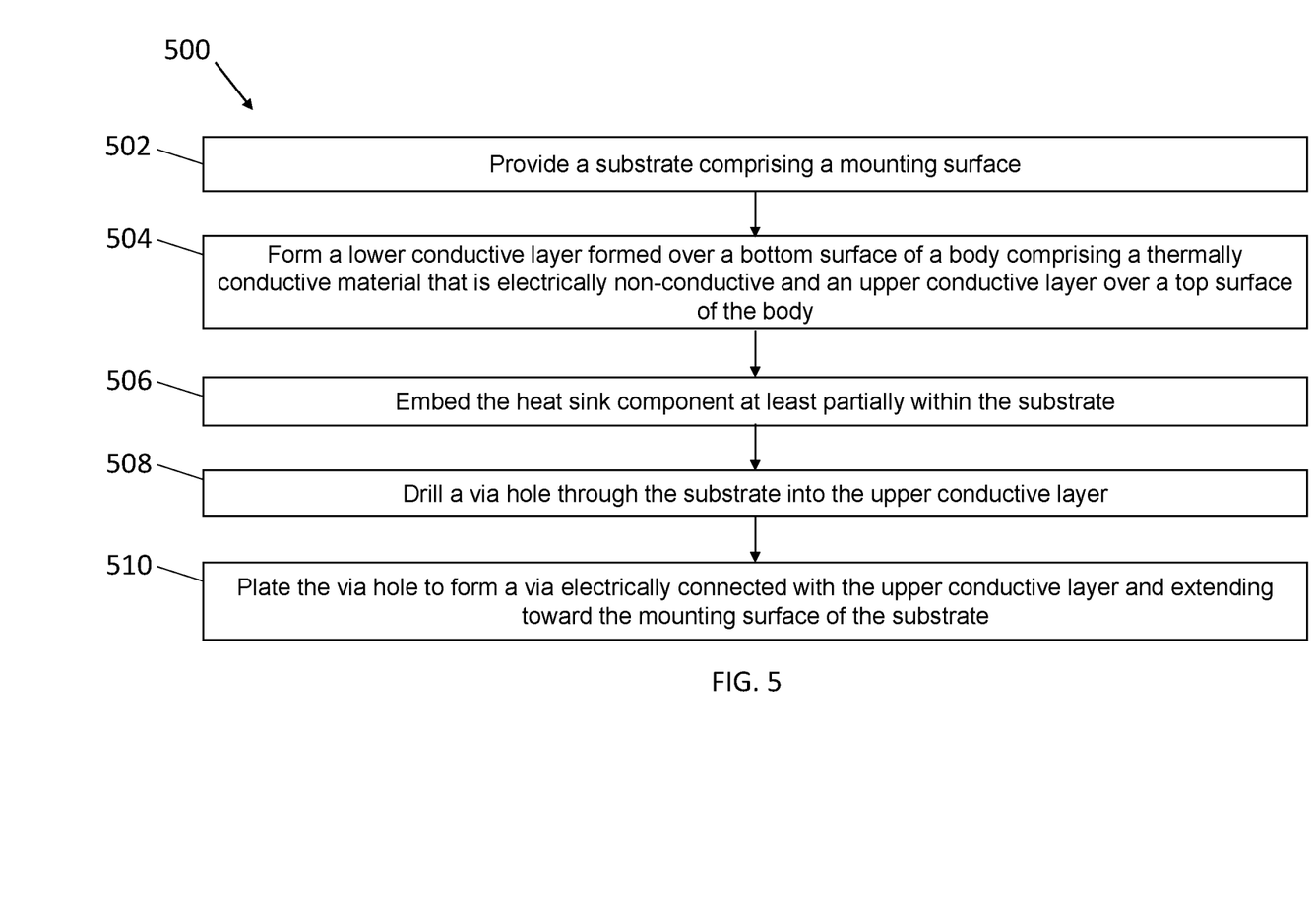
FIG. 5 is a flowchart of a method of manufacturing a circuit board including an embedded heat sink component according to aspects of the present disclosure.

FIG. 5 is a flowchart of a method 500 of manufacturing a circuit board including an embedded heat sink component. In general, the method 500 will be described herein with reference to the circuit boards 100, 300, 400 of FIG. 1-4B. However, it should be appreciated that the disclosed method 500 may be implemented with any suitable circuit board including a heat sink component. In addition, although FIG. 5 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 502, providing a substrate 102 including a mounting surface 104. The substrate 102 can include a ground plane layer 106 spaced apart from the mounting surface 104.

The method can include, at 504, forming a lower conductive layer 114 formed over a bottom surface 116 of a body 112 of a heat sink component 110. The body 112 can include a thermally conductive material that is electrically non-conductive. One or more upper conductive layers 118, 119 can be formed over a top surface 104 of the body 102.

The method can include, at 506, embedding the heat sink component 110 at least partially within the substrate 102 such that the lower conductive layer 114 of the heat sink component 110 is electrically connected with the ground plane layer 106.

The method can include, at 508, drilling one or more via holes through the substrate 102 into the upper conductive layer 118, 119. Mechanical drilling, laser drilling, or any other suitable technique may be employed.

The method can include, at 510, plating the via hole(s) to form one or more via(s) 122, 124 electrically connected with the upper conductive layer(s) 122, 124 and extending toward the mounting surface 104 of the substrate 102. Electrolytic plating, electroless plating, and/or any other suitable plating technique may be employed.

Applications

The various embodiments of embeddable heat sink components and circuit boards including embedded heat sink components disclosed herein may have a variety of applications.

For example, the heat sink component may facilitate heat flow from the terminals 126, 128 on the mounting surface 104 to the ground plane layer 106. As examples, various embodiments suitable electrical components can be mounted on the mounting surface 104, such as a power amplifier, filter, synthesizer, computer component, power supply, and/or diode, for example. Specific examples of power amplifier types include Gallium Nitride (GaN) power amplifiers, high radio frequency amplifiers, and the like. Examples of diodes which may be suitable for connection with a thermal component, as described herein, may include diodes specifically adapted for use in lasers, among other types of diodes.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A heat sink component comprising:
a body comprising a thermally conductive material that is electrically non-conductive;
a lower conductive layer formed over a bottom surface of the body and electrically connected with a ground plane layer;
a plurality of upper conductive layers formed on a top surface of the body, the plurality of upper conductive layers electrically isolated from the lower conductive layer;
wherein the heat sink component has a length in an X-direction that is parallel with the top surface of the body and a thickness in a direction perpendicular to the top surface,
wherein a ratio of the length to the thickness is greater than about 7, and
wherein the plurality of upper conductive layers are arranged in a grid pattern having rows extending in the X-direction and columns extending in the Y-direction.

2. The heat sink component of claim 1, further comprising at least one thin film component formed on at least one of the top surface, the bottom surface, or a side surface of the body.

3. The heat sink component of claim 2, wherein the at least one thin film component comprises one or more of a resistor, varistor, capacitor, or inductor.

4. The heat sink component of claim 1, wherein the upper conductive layer has a thickness in a Z-direction that is greater than about 1 micron.

5. The heat sink component of claim 1, wherein the heat sink component has a width in a Y-direction that is perpendicular to the X-direction and parallel with the top surface, and wherein a ratio of the width of the heat sink component to the length of the heat sink component ranges from 0.2 to 5.

6. The heat sink component of claim 1, wherein the heat sink component comprises a material having a thermal conductivity from about 150 W/m·° C. to about 300 W/m·° C. at about 22° C.

7. The heat sink component of claim 1, wherein the heat sink component comprises aluminum nitride.

8. The heat sink component of claim 1, wherein the heat sink component comprises beryllium oxide.

9. The heat sink component of claim 1, wherein the thickness of the heat sink component is less than about 250 microns.

10. A circuit board comprising:
a substrate comprising a mounting surface;
a ground plane layer spaced apart from the mounting surface;
a first heat sink terminal on the mounting surface;
a second heat sink terminal on the mounting surface; and
a heat sink component at least partially embedded within the substrate, the heat sink component comprising:
a body comprising a thermally conductive material that is electrically non-conductive;

a lower conductive layer formed over a bottom surface of the body and electrically connected with the ground plane layer;

an upper conductive layer formed over a top surface of the body;

a first via electrically connected with the upper conductive layer and extending toward the mounting surface; and a second via electrically connected with the upper conductive layer and extending toward the mounting surface, the second via spaced apart from the first via in both an X-direction and a Y-direction such that the first via and the second via are not aligned with one another in the X-direction or the Y-direction, wherein the X-direction and the Y-direction are both parallel to the top surface of the body and perpendicular to one another, wherein the first via extends from the upper conductive layer of the heat sink component to the mounting surface of the circuit board and connects with the first heat sink terminal of the circuit board, and wherein the second via extends from the upper conductive layer of the heat sink component to the mounting surface of the circuit board and connects with the second heat sink terminal of the circuit board.

11. The circuit board of claim 10, wherein the lower conductive layer of the heat sink component directly contacts the ground plane layer.

12. The circuit board of claim 10, further comprising at least an additional via that electrically connects the lower conductive layer with the ground plane layer.

13. The circuit board of claim 10, wherein the heat sink component further comprises at least one thin film component formed on at least one of the top surface, the bottom surface, or a side surface of the body.

14. The circuit board of claim 10, wherein the heat sink component has a length in the X-direction parallel with the mounting surface of the substrate and a thickness in a direction perpendicular to the mounting surface, and wherein a ratio of the length to the thickness is greater than about 7.

15. The circuit board of claim 10, wherein the heat sink component further comprises at least one additional upper conductive layer formed on the top surface of the body of the heat sink component, and wherein the at least one additional upper conductive layer is spaced apart on the top surface from the upper conductive layer.

16. The circuit board of claim 15, wherein the at least one additional upper conductive layer and the upper conductive layer are arranged in a repeating pattern on the top surface of the body of the heat sink component.

17. The circuit board of claim 10, wherein the upper conductive layer has a thickness in a Z-direction that is greater than about 1 micron.

18. The circuit board of claim 10, wherein the heat sink component has a width in the Y-direction, and wherein a ratio of the width of the heat sink component to the length of the heat sink component ranges from 0.2 to 5.

19. The circuit board of claim 10, wherein the heat sink component comprises a material having a thermal conductivity from about 150 W/m·° C. to about 300 W/m·° C. at about 22° C.

20. The circuit board of claim 19, wherein the heat sink component comprises aluminum nitride.

21. The circuit board of claim 10, wherein the heat sink component comprises beryllium oxide.

22. The circuit board of claim 10, wherein the thickness of the heat sink component is less than about 250 microns.

23. The circuit board of claim 10, further comprising:

at least an additional via that electrically connects the lower conductive layer of the heat sink component with the ground plane layer of the circuit board, wherein the upper conductive layer of the heat sink component is electrically isolated from the lower conductive layer such that the heat sink terminal is electrically isolated from the ground plane layer.

\* \* \* \* \*